United States Patent
Shaharabany et al.

(10) Patent No.: US 9,990,158 B2
(45) Date of Patent: Jun. 5, 2018

(54) STORAGE SYSTEM AND METHOD FOR BURST MODE MANAGEMENT USING TRANSFER RAM

(71) Applicant: SanDisk Technologies LLC, Plano, TX (US)

(72) Inventors: Amir Shaharabany, Kochav Yair (IL); Yoav Markus, Tel Aviv (IL); Tal Heller, Alonay Abba (IL); Hadas Oshinsky, Kfar Saba (IL)

(73) Assignee: SanDisk Technologies LLC, Plano, TX (US)

( * ) Notice: Subject to any disclaimer, the term of this patent is extended or adjusted under 35 U.S.C. 154(b) by 45 days.

(21) Appl. No.: 15/189,684

(22) Filed: Jun. 22, 2016

(65) Prior Publication Data

US 2017/0371588 A1    Dec. 28, 2017

(51) Int. Cl.
G06F 3/06      (2006.01)
G11C 14/00   (2006.01)
G06F 13/16   (2006.01)

(52) U.S. Cl.
CPC ............ *G06F 3/0659* (2013.01); *G06F 3/061* (2013.01); *G06F 3/068* (2013.01); *G06F 3/0655* (2013.01); *G06F 3/0688* (2013.01); *G06F 13/1673* (2013.01); *G11C 14/00* (2013.01)

(58) Field of Classification Search
CPC ...... G06F 3/061; G06F 3/0659; G06F 3/0656; G06F 2212/205; G06F 3/0655; G06F 13/1673; G06F 3/068
See application file for complete search history.

(56) References Cited

U.S. PATENT DOCUMENTS

| | | | |
|---|---|---|---|
| 5,948,081 A | 9/1999 | Foster | |
| 6,049,798 A * | 4/2000 | Bishop | ................ G06F 11/3495 |
| 6,615,308 B1 | 9/2003 | Fanning | |
| 8,187,936 B2 | 5/2012 | Alsmeier et al. | |
| 2003/0093633 A1 | 5/2003 | Thiesfeld et al. | |

(Continued)

FOREIGN PATENT DOCUMENTS

EP    0 374 764 A2    6/1990

OTHER PUBLICATIONS

International Search Report and Written Opinion in corresponding International Application No. PCT/US217/018888, dated May 11, 2017, 13 pages.

(Continued)

*Primary Examiner* — Reginald G Bragdon
*Assistant Examiner* — Thanh D Vo
(74) *Attorney, Agent, or Firm* — Brinks Gilson & Lione

(57) ABSTRACT

A storage system uses consumption of transfer RAM as a trigger to enter and exit burst mode. In one embodiment, the storage system stores, in volatile memory, data to be written in non-volatile memory; monitors an allocation level of the volatile memory to determine a first amount of time that the allocation level is at a first level and a second amount of time that the allocation level is at second level; enters burst mode when a ratio of the first amount of time and the second amount of time is above a first threshold; and exits burst mode when the ratio of the first amount of time and the second amount of time is below a second threshold. Other embodiments are possible, and each of the embodiments can be used alone or together in combination.

23 Claims, 7 Drawing Sheets

(56) References Cited

U.S. PATENT DOCUMENTS

| | | |
|---|---|---|
| 2006/0083069 A1 | 4/2006 | Fasoli |
| 2006/0123320 A1 | 6/2006 | Vogt |
| 2007/0016725 A1 | 1/2007 | Chu et al. |
| 2007/0055813 A1 | 3/2007 | Ingram et al. |
| 2008/0222348 A1* | 9/2008 | Mosek .............. G06F 17/30067 711/103 |
| 2008/0270678 A1 | 10/2008 | Cornwell et al. |
| 2009/0222639 A1 | 9/2009 | Hyvonen et al. |
| 2010/0118434 A1 | 5/2010 | Inoue |
| 2010/0191874 A1 | 7/2010 | Feeley et al. |
| 2010/0262766 A1 | 10/2010 | Sprinkle et al. |
| 2010/0287217 A1 | 11/2010 | Borchers et al. |
| 2012/0159051 A1 | 6/2012 | Hida et al. |
| 2012/0254505 A1 | 10/2012 | Chishtie et al. |
| 2012/0254966 A1 | 10/2012 | Parker |
| 2012/0311293 A1 | 12/2012 | Nemazie et al. |
| 2013/0024641 A1 | 1/2013 | Talagala et al. |
| 2013/0031307 A1 | 1/2013 | Itoh |
| 2013/0054929 A1 | 2/2013 | Balk et al. |
| 2013/0246582 A1 | 9/2013 | Lee et al. |
| 2013/0270643 A1 | 10/2013 | Lee et al. |
| 2013/0282955 A1 | 10/2013 | Parker et al. |
| 2013/0305247 A1 | 11/2013 | Easton et al. |
| 2014/0122774 A1 | 5/2014 | Xian et al. |
| 2014/0281127 A1 | 9/2014 | Marcu et al. |
| 2015/0301763 A1 | 10/2015 | Shaharabany et al. |
| 2015/0324119 A1 | 11/2015 | Romanovsky et al. |
| 2015/0363272 A1* | 12/2015 | Zheng ................. G06F 11/1456 714/19 |
| 2016/0266826 A1* | 9/2016 | Ooneda ................. G11C 29/789 |

OTHER PUBLICATIONS

Application as Filed for U.S. Appl. No. 13/829,010 entitled, "Storage Module and Method for Regulating Garbage Collection Operations based on Write Activity of a Host", filed Mar. 14, 2013, 23 pages.

"Write Amplification", http://en.wikipedia.org/wiki/Write_amplification, 13 pages, printed Mar. 9, 2013.

Application as Filed for U.S. Appl. No. 14/133,979 filed Dec. 19, 2013, 121 pages.

Application as Filed for U.S. Appl. No. 14/136,103 filed Dec. 20, 2013, 56 pages.

Jang et al., "Vertical Cell Array using TCAT(Terabit Cell Array Transistor) Technology for Ultra High Density NAND Flash Memory," *2009 Symposium on VLSI Technology Digest of Technical Papers*, pp. 192-193, 2009.

Arya, P., "A Survey of 3D Nand Flash Memory", *EECS Int'l Graduate Program, National Chiao Tung University*, 2012, pp. 1-11.

Nowak, E. et al., "Intrinsic Fluctuations in Vertical NAND Flash Memories", *2012 Symposium on VLSI Technology Digest of Technical Papers*, 2012, pp. 21-22.

Office Action for U.S. Appl. No. 13/829,010 dated Feb. 11, 2015, 19 pages.

Invitation to Pay Fees for PCT/US2015/023337 dated Jun. 8, 2015, 5 pages.

Office Action for U.S. Appl. No. 13/829,010 dated Jul. 15, 2015, 22 pages.

International Search Report and Written Opinion for PCT/US2015/023337 dated Aug. 18, 2015, 12 pages.

Application as Filed for U.S. Appl. No. 14/254,393 entitled, "Storage Module and Method for Adaptive Burst Mode", filed Apr. 16, 2014, 31 pages.

Office Action issued in U.S. Appl. No. 14/254,393, dated Jun. 16, 2014, 18 pages.

Office Action issued in U.S. Appl. No. 14/254,393, dated Oct. 22, 2014, 18 pages.

Office Action for U.S. Appl. No. 14/254,393 dated May 5, 2015, 19 pages.

Office Action for U.S. Appl. No. 14/254,393 dated Oct. 2, 2015, 21 pages.

Office Action for U.S. Appl. No. 14/254,393 dated Mar. 28, 2016, 21 pages.

Office Action in U.S. Appl. No. 13/829,010 dated Jun. 17, 2016, 21 pages.

* cited by examiner

| ADDR | STATUS |
|---|---|
| 0 | ALLOCATED |
| 1 | ALLOCATED |
| 2 | ALLOCATED |
| 3 | FREE |
| - - - | |

STORAGE SYSTEM AND METHOD FOR BURST MODE MANAGEMENT USING TRANSFER RAM

BACKGROUND

Storage systems may be used in different conditions, which place different performance requirements on the memory in the storage system. To account for these different conditions, memories in some storage systems can be operated in a "normal" mode or in a "burst" mode, in which a higher-than-average performance by the storage system is required to satisfy a higher-than-average number of write commands from a host controller. For example, in some storage systems, the burst mode may be capable of supporting a storage rate of 160 MB/s for 4 GB (e.g., when raw video shot by a camera is sent to the storage system for storage), while the normal mode may support rates of up to 80 MB/s for 12 GB. To achieve the higher-than-average performance and provide high throughput in burst mode, the storage system can store data in single-level cells (SLCs) instead of multi-level cells (MLCs), as writing to SLC cells (X1) is faster than writing to MLC cells (e.g., X3).

To trigger burst mode, a host can send a request or other indication to signal that the storage system should switch to burst mode. However, in many environments, the host does not provide such an indication, and the storage system needs to manage the transition to and from burst mode autonomously. A storage system may infer burst mode by monitoring the data transfer rate over an interface from the host, and if the throughput is above a first threshold, a transition to burst mode may be performed. Similarly, terminating burst mode and transitioning back to normal mode may be done when the transfer rate is below a second threshold. As another technique, the storage system may "sniff" the interface and infer from a header of incoming data if the data is of a type that is suitable for burst mode (e.g., video or data in an mpeg format).

DETAILED DESCRIPTION

Overview

Figure 1A:
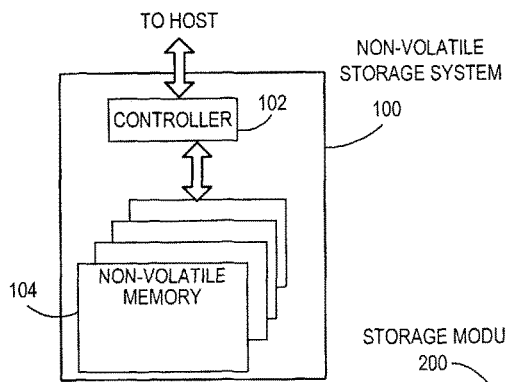
FIG. 1A is a block diagram of a non-volatile storage system of an embodiment.

By way of introduction, the below embodiments relate to a storage system and method for burst mode management using transfer RAM. In one embodiment, a method is provided that is performed in a storage system comprising a non-volatile memory and a volatile memory. The method comprises storing, in the volatile memory, data to be written in the non-volatile memory; monitoring an allocation level of the volatile memory to determine a first amount of time that the allocation level of the volatile memory is at a first level and a second amount of time that the allocation level of the volatile memory is at second level; entering burst mode when a ratio of the first amount of time and the second amount of time is above a first threshold; and exiting burst mode when the ratio of the first amount of time and the second amount of time is below a second threshold.

In some embodiments, the first level is when the non-volatile memory is full, and the second level is when the non-volatile memory is less than full.

In some embodiments, the method further comprises storing, in the volatile memory, data read from the non-volatile memory, wherein the allocation level of the volatile memory accounts for both data to be stored in the non-volatile memory and data read from the non-volatile memory.

In some embodiments, after entering burst mode, the storage system stores the data from the volatile memory in single-level cells in the non-volatile memory, and wherein after exiting burst mode, the storage system uses multi-level cells in the non-volatile memory.

In some embodiments, the non-volatile memory comprises a three-dimensional memory.

In some embodiments, the storage system is embedded in a host.

In some embodiments, the storage system is removably connected to a host.

In another embodiment, a storage system is provided comprising a first memory; a second memory configured to temporarily store data before it is stored in the first memory; and a controller in communication with the first and second memories. The controller is configured to determine a fill level of the second memory and enter or exit burst mode based on the fill-level of the second memory.

In some embodiments, the first memory comprises a non-volatile memory and the second memory comprises a volatile memory.

In some embodiments, the controller is configured to determine the fill level of the second memory by determining how much of the second memory has been allocated.

In some embodiments, the controller is further configured to determine a first amount of time that the fill level of the second memory is at a first level and a second amount of time that the fill level of the second memory is at second level, wherein the controller is configured to enter burst mode when a ratio of the first amount of time and the second amount of time is above a first threshold, and wherein the controller is configured to exit burst mode when the ratio of the first amount of time and the second amount of time is below a second threshold.

In some embodiments, the first level is when the volatile memory is full, and the second level is when the volatile memory is less than full.

In some embodiments, the second memory is further configured to temporarily store data read from the first memory, and wherein the fill level of the second memory is due to both data to be stored in the first memory and data read from the first memory.

In some embodiments, the controller is further configured to store the data from the second memory in single-level cells in the first memory after entering burst mode and use multi-level cells in the first memory after exiting burst mode.

In some embodiments, the first memory comprises a three-dimensional memory.

In some embodiments, the storage system is embedded in a host.

In some embodiments, the storage system is removably connected to a host.

In another embodiment, a storage system is provided comprising a memory; a transfer memory configured to hold data before the data is sent to the memory for storage; and means for using consumption of the transfer memory as a trigger to enter and exit burst mode.

In some embodiments, the transfer memory is further configured to hold data read from the memory.

In some embodiments, the means for using comprises a controller.

In some embodiments, the memory comprises a three-dimensional memory.

In some embodiments, the storage system is embedded in a host.

In some embodiments, the storage system is removably connected to a host.

Other embodiments are possible, and each of the embodiments can be used alone or together in combination. Accordingly, various embodiments will now be described with reference to the attached drawings.

Exemplary Embodiments

Figure 1B:
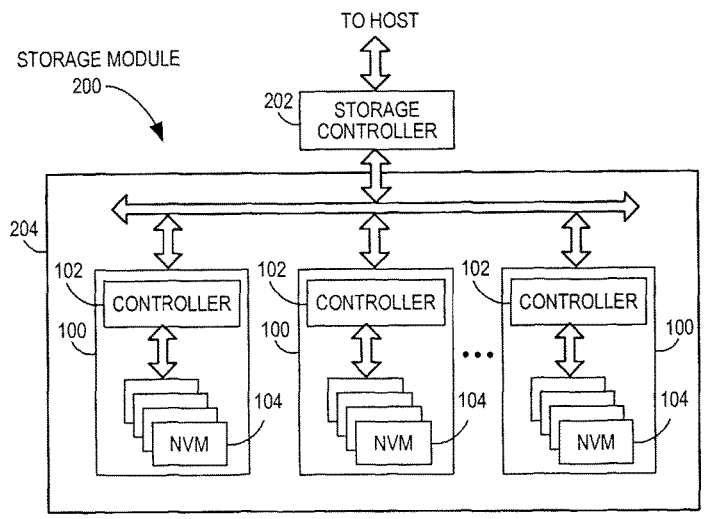
FIG. 1B is a block diagram illustrating an exemplary storage module of an embodiment.
Figure 1C:
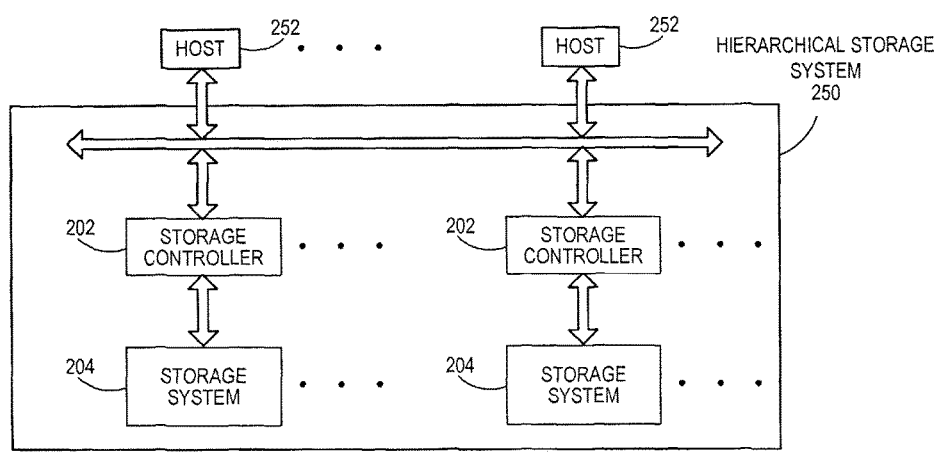
FIG. 1C is a block diagram illustrating a hierarchical storage system of an embodiment.

Storage systems suitable for use in implementing aspects of these embodiments are shown in FIGS. 1A-1C. FIG. 1A is a block diagram illustrating a non-volatile storage system 100 according to an embodiment of the subject matter described herein. Referring to FIG. 1A, non-volatile storage system 100 includes a controller 102 and non-volatile memory that may be made up of one or more non-volatile memory die 104. As used herein, the term die refers to the collection of non-volatile memory cells, and associated circuitry for managing the physical operation of those non-volatile memory cells, that are formed on a single semiconductor substrate. Controller 102 interfaces with a host system and transmits command sequences for read, program, and erase operations to non-volatile memory die 104.

The controller 102 (which may be a flash memory controller) can take the form of processing circuitry, a microprocessor or processor, and a computer-readable medium that stores computer-readable program code (e.g., firmware) executable by the (micro)processor, logic gates, switches, an application specific integrated circuit (ASIC), a programmable logic controller, and an embedded microcontroller, for example. The controller 102 can be configured with hardware and/or firmware to perform the various functions described below and shown in the flow diagrams. Also, some of the components shown as being internal to the controller can also be stored external to the controller, and other components can be used. Additionally, the phrase "operatively in communication with" could mean directly in communication with or indirectly (wired or wireless) in communication with through one or more components, which may or may not be shown or described herein.

As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare cells to be substituted for future failed cells. Some part of the spare cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. (Alternatively, the host can provide the physical address.) The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

Non-volatile memory die 104 may include any suitable non-volatile storage medium, including NAND flash memory cells and/or NOR flash memory cells. The memory cells can take the form of solid-state (e.g., flash) memory cells and can be one-time programmable, few-time programmable, or many-time programmable. The memory cells can also be single-level cells (SLC), multiple-level cells (MLC), triple-level cells (TLC), or use other memory cell level technologies, now known or later developed. Also, the memory cells can be fabricated in a two-dimensional or three-dimensional fashion.

The interface between controller 102 and non-volatile memory die 104 may be any suitable flash interface, such as Toggle Mode 200, 400, or 800. In one embodiment, storage system 100 may be a card based system, such as a secure digital (SD) or a micro secure digital (micro-SD) card. In an alternate embodiment, storage system 100 may be part of an embedded storage system.

Although, in the example illustrated in FIG. 1A, non-volatile storage system 100 (sometimes referred to herein as a storage module) includes a single channel between controller 102 and non-volatile memory die 104, the subject matter described herein is not limited to having a single memory channel. For example, in some NAND storage system architectures (such as the ones shown in FIGS. 1B and 1C), 2, 4, 8 or more NAND channels may exist between the controller and the NAND memory device, depending on controller capabilities. In any of the embodiments described herein, more than a single channel may exist between the controller and the memory die, even if a single channel is shown in the drawings.

FIG. 1B illustrates a storage module 200 that includes plural non-volatile storage systems 100. As such, storage module 200 may include a storage controller 202 that interfaces with a host and with storage system 204, which includes a plurality of non-volatile storage systems 100. The interface between storage controller 202 and non-volatile storage systems 100 may be a bus interface, such as a serial advanced technology attachment (SATA) or peripheral component interface express (PCIe) interface. Storage module 200, in one embodiment, may be a solid state drive (SSD), such as found in portable computing devices, such as laptop computers, and tablet computers.

FIG. 1C is a block diagram illustrating a hierarchical storage system. A hierarchical storage system 250 includes a plurality of storage controllers 202, each of which controls a respective storage system 204. Host systems 252 may access memories within the storage system via a bus interface. In one embodiment, the bus interface may be an NVMe or fiber channel over Ethernet (FCoE) interface. In one embodiment, the system illustrated in FIG. 1C may be a rack mountable mass storage system that is accessible by multiple host computers, such as would be found in a data center or other location where mass storage is needed.

Figure 2A:
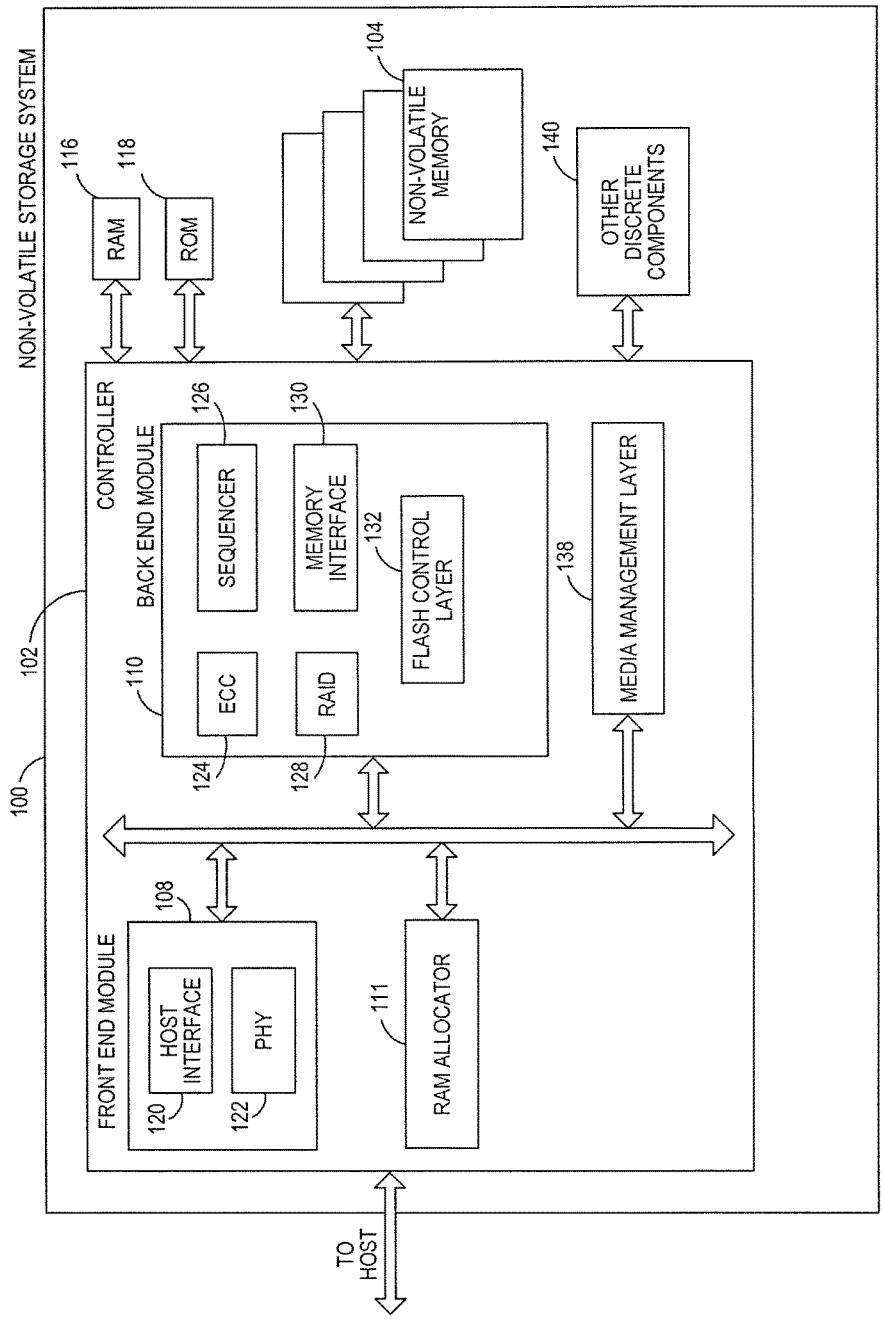
FIG. 2A is a block diagram illustrating exemplary components of the controller of the non-volatile storage system illustrated in FIG. 1A according to an embodiment.

FIG. 2A is a block diagram illustrating exemplary components of controller 102 in more detail. Controller 102 includes a front end module 108 that interfaces with a host, a back end module 110 that interfaces with the one or more non-volatile memory die 104, and various other modules that perform functions which will now be described in detail. Modules of the controller 102 may include a RAM allocator 111 that is configured to allocate space in the RAM 116 and to keep track of the fill-level of the RAM 116. The RAM allocator 111 will be discussed in more detail below. It should be noted, though, that a module, circuit, or monitor may take the form of a packaged functional hardware unit designed for use with other components, a portion of a program code (e.g., software or firmware) executable by a (micro)processor or processing circuitry that usually performs a particular function of related functions, or a self-contained hardware or software component that interfaces with a larger system, for example.

Referring again to modules of the controller 102, a buffer manager/bus controller 114 manages buffers in random access memory (RAM) 116 and controls the internal bus arbitration of controller 102. A read only memory (ROM) 118 stores system boot code. Although illustrated in FIG. 2A as located separately from the controller 102, in other embodiments one or both of the RAM 116 and ROM 118 may be located within the controller. In yet other embodiments, portions of RAM and ROM may be located both within the controller 102 and outside the controller.

Front end module 108 includes a host interface 120 and a physical layer interface (PHY) 122 that provide the electrical interface with the host or next level storage controller. The choice of the type of host interface 120 can depend on the type of memory being used. Examples of host interfaces 120 include, but are not limited to, SATA, SATA Express, SAS, Fibre Channel, USB, PCIe, and NVMe. The host interface 120 typically facilitates transfer for data, control signals, and timing signals.

Back end module 110 includes an error correction controller (ECC) engine 124 that encodes the data bytes received from the host, and decodes and error corrects the data bytes read from the non-volatile memory. A command sequencer 126 generates command sequences, such as program and erase command sequences, to be transmitted to non-volatile memory die 104. A RAID (Redundant Array of Independent Drives) module 128 manages generation of RAID parity and recovery of failed data. The RAID parity may be used as an additional level of integrity protection for the data being written into the memory device 104. In some cases, the RAID module 128 may be a part of the ECC engine 124. A memory interface 130 provides the command sequences to non-volatile memory die 104 and receives status information from non-volatile memory die 104. In one embodiment, memory interface 130 may be a double data rate (DDR) interface, such as a Toggle Mode 200, 400, or 800 interface. A flash control layer 132 controls the overall operation of back end module 110.

The storage system 100 also includes other discrete components 140, such as external electrical interfaces, external RAM, resistors, capacitors, or other components that may interface with controller 102. In alternative embodiments, one or more of the physical layer interface 122, RAID module 128, media management layer 138 and buffer management/bus controller 114 are optional components that are not necessary in the controller 102.

Figure 2B:
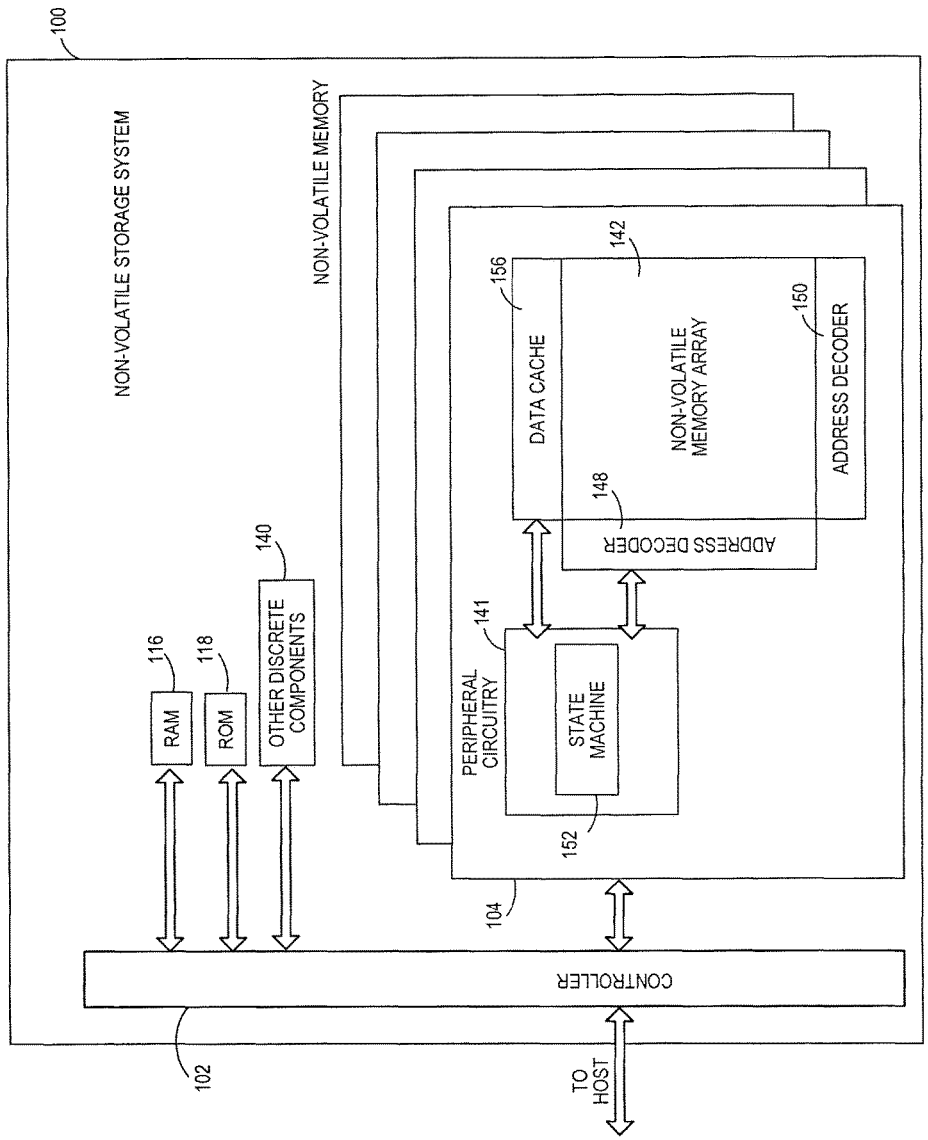
FIG. 2B is a block diagram illustrating exemplary components of the non-volatile memory storage system illustrated in FIG. 1A according to an embodiment.

FIG. 2B is a block diagram illustrating exemplary components of non-volatile memory die 104 in more detail. Non-volatile memory die 104 includes peripheral circuitry 141 and non-volatile memory array 142. Non-volatile memory array 142 includes the non-volatile memory cells used to store data. The non-volatile memory cells may be any suitable non-volatile memory cells, including NAND flash memory cells and/or NOR flash memory cells in a two dimensional and/or three dimensional configuration. Peripheral circuitry 141 includes a state machine 152 that provides status information to controller 102.

In one embodiment, the storage system 100 can be used in a "normal" mode or in "burst" mode. In burst mode, the storage system 100 provides higher-than-average performance and higher-than-average throughput by storing data in single-level cells (SLCs) in the memory 104 instead of multi-level cells (MLCs), as writing to SLC cells (X1) is faster than writing to MLC cells (e.g., X3). By way of example only and without intending any limitation on the claims, in one embodiment, the storage system 100 may be capable of supporting a storage rate of 160 MB/s for 4 GB (e.g., when raw video shot by a camera is sent to the storage system for storage) while in burst mode, while the normal mode may support rates of up to 80 MB/s for 12 GB. Optionally, the memory management software/firmware of the storage module 100 can be configured to avoid garbage collection operations during burst mode, as the number of memory cells available to store data is temporarily reduced during the garbage collection process. Also optionally, less-robust ECC parameters (e.g., the number of parity bits used, the minimum Hamming distance used, etc.) can be used to increase write performance in burst mode, or ECC may not even be used as all in burst mode. It should be noted that while the below embodiments will use the term "burst mode," a single burst mode (with a certain storage rate) can be used or a plurality of different burst modes (with different storage rates) can be used. In this way, the storage system 100 can choose a burst mode that fits a desired performance.

There are several ways in which burst mode can be triggered. For example, a host can send a request or other indication to signal that the storage system should switch to burst mode. However, in many environments, the host does not provide such an indication, and the storage system 100 would need to manage the transition to and from burst mode autonomously. The storage system 100 may detect burst mode by monitoring the data transfer rate over an interface from the host, and if the throughput is above a first threshold, a transition to burst mode may be performed. Similarly, terminating burst mode and transitioning back to normal mode may be done when the transfer rate is below a second threshold. As another technique, the storage system 100 may "sniff" the interface and infer from a header of incoming data if the data is of a type that is suitable for burst mode (e.g., video or data in an mpeg format).

One issue with these approaches is that they only consider what is coming from the host and not the storage limitations of the RAM 116. In one embodiment, the RAM 116 acts as a temporary storage unit for data (e.g., received from the host) to be written to the non-volatile memory 104 and also as a temporary storage unit for data read from the non-volatile memory 104 (e.g., before sending the data to the host). Because of this, the RAM 116 is sometimes referred to herein as "transfer RAM," "cache RAM," or "buffer RAM". However, it should be understood that another type of storage unit (e.g., a non-volatile memory) can be used to temporarily store data. But, for simplicity, the RAM 116 will be used to illustrate this embodiment.

The problem with burst activity is that the RAM 116 can fill up faster than the rate at which the data is transferred from RAM 116 to the non-volatile memory 104 for storage. In this situation, incoming data from the host will be prevented until there is available space in the RAM 116, which can degrade performance. By entering burst mode, data is transferred out of RAM 116 faster, so there is room to accept incoming data. In prior trigger approaches that only consider what is coming from the host, there may be data in the RAM 116 that was read from the memory 104 and consuming space in the RAM 116. That is, those prior approaches were not designed for mix mode (i.e., write and read commands interleaved), as they only consider write operations' impact on the RAM 116. The read operations confuse the detection, even though they are part of the burst.

Figures 3, 4:
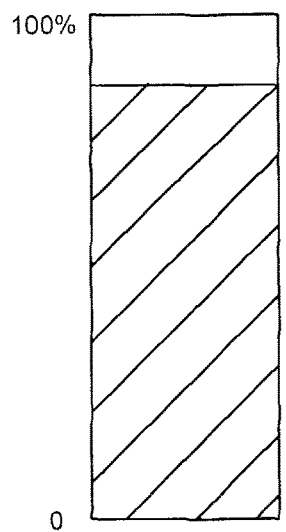
FIG. 3 is a transfer RAM allocation table of an embodiment.
FIG. 4 is a fill-level indicator of an embodiment.

To address this situation, the following embodiments use consumption of the transfer memory (e.g., RAM 116) as a trigger to enter and exit burst mode. Since the transfer memory is an input/output data reservoir—both for data to be stored in the memory 104 and data read from the memory 104, its level (amount of stored data) is an appropriate indication for entering or exiting burst mode. Consider, for example, the situation in which the transfer RAM 116 has a size of 128 KB, and the transfer RAM allocator 111 (FIG. 2A) manages the allocations from the transfer RAM 116. As shown in FIG. 3, in one embodiment, the transfer RAM allocator 111 can store a table (or other data structure) that lists the addresses in the transfer RAM 116 and whether or not that address is allocated. In another embodiment, which is shown in FIG. 4, the transfer RAM allocator 111 can have an indicator for the allocated amount of RAM 116 that shows the transfer RAM allocation level. Of course, these are just examples, and other mechanisms used to judge the allocation, fill-level, or consumption of the transfer RAM 116 can be used.

In general, if the transfer RAM allocation level is equal to the size of the transfer RAM 116 (i.e., the transfer RAM 116 is full) for a long period of time, the storage controller 102 is experiencing a burst condition, since whenever the transfer RAM 116 is deallocated, it is immediately reallocated for the next command. On the other hand, if the transfer RAM allocation level is less than the size of the transfer RAM 116 (i.e., the transfer RAM 116 is not full) for a long period of time, the storage controller 102 is in a non-burst condition. Monitoring the allocation level indicator allow the storage controller 102 to decide whether or not a burst condition exists and, hence, whether or not the storage system 100 should go into burst mode.

In one embodiment, the storage system 100 generates two event triggers: a transfer RAM full event and a transfer RAM not-full event. These events can be defined in any desirable way. In one embodiment, a transfer RAM full event occur when the transfer RAM 116 is completely allocated, and the transfer RAM not-full event occurs after the first chunk of data (e.g., 4K) is evicted from the transfer RAM 116. The controller 102 can use these events to enter or exit burst mode.

In another embodiment, the storage system 100 can be configured to regularly accumulate the time between the transfer RAM full event and the transfer RAM not-full event (the numerator) within a time window (e.g., 50 milliseconds). Similarly, the storage system 100 can be configured to accumulate the complementary time between transfer RAM not-full event to the next transfer RAM full event (the denominator) in the same time window. In this embodiment, the ratio between these values (the transfer RAM full time divided by the transfer RAM not-full time) can be used as the trigger for entering and exiting burst mode. This embodiment will be described in more detail below in conjunction with the flow chart 500 of FIG. 5.

Figure 5:
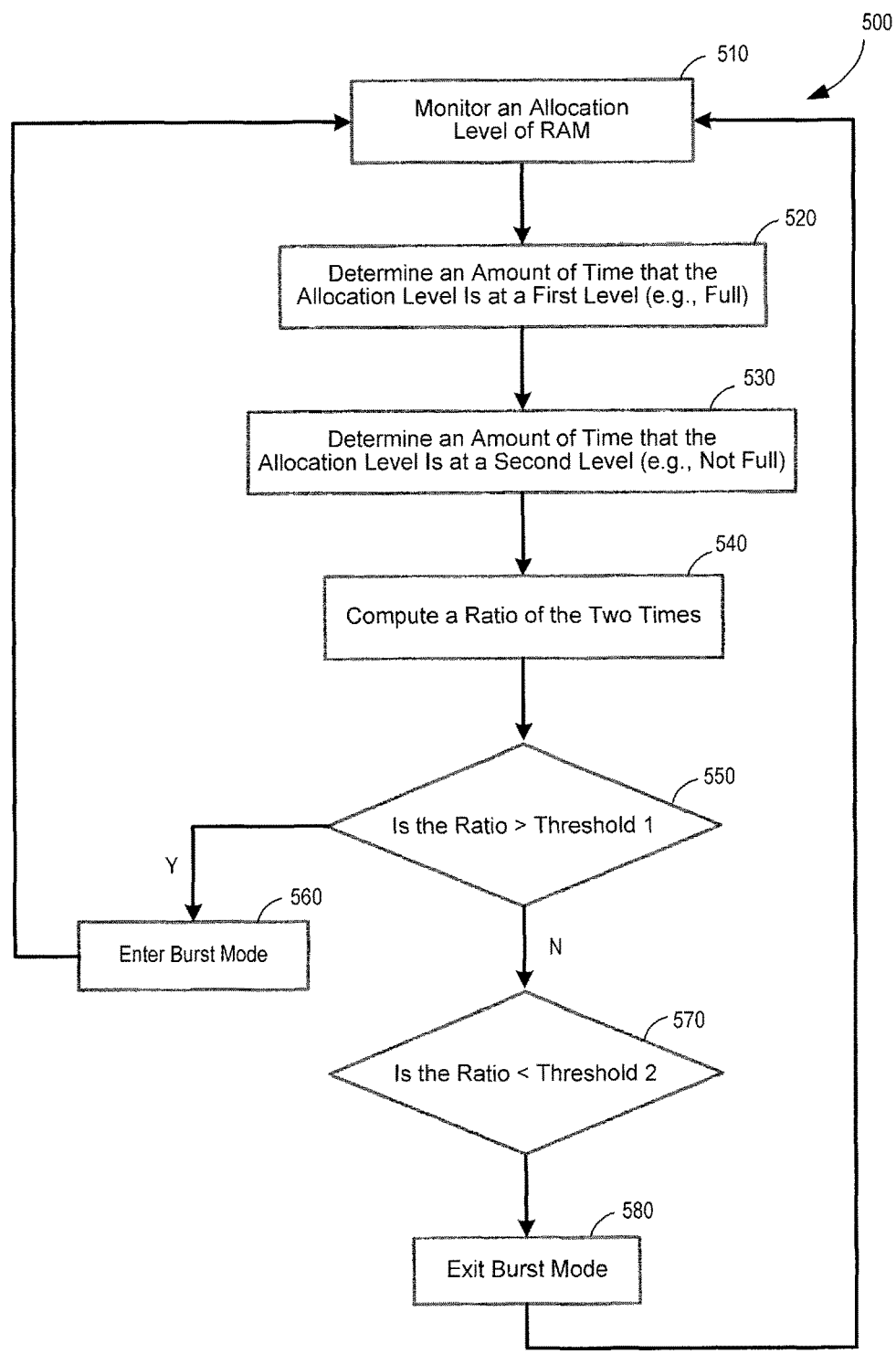
FIG. 5 is flow chart of a method of an embodiment for burst mode management using transfer RAM.

As shown in FIG. 5, the storage system 100 (e.g., the controller 102 generally or the RAM allocator 111 in particular) monitors an allocation level of the RAM 116 (act 510). As discussed above, this monitoring can be performed in any suitable way, such as, but not limited to, using an allocation table or an allocation fill-level indicator. Next, the storage system 100 determines an amount of time that the allocation level is at a first level (act 520). In this embodiment, the "first level" is the transfer RAM full level (i.e., when the transfer RAM 116 is completely allocated). However, in other embodiments, this "first level" can be set at a different level (e.g., 95% of full capacity). The storage system 100 also determines an amount of time that the allocation level is at a second level (act 530). In this embodiment, the "second level" is any level other than the transfer RAM full level (i.e., even when the smallest "chunk" is available in the transfer RAM 115). In other embodiments, this "second level" can be set at a different level (e.g., 95% of full capacity).

Figure 6:
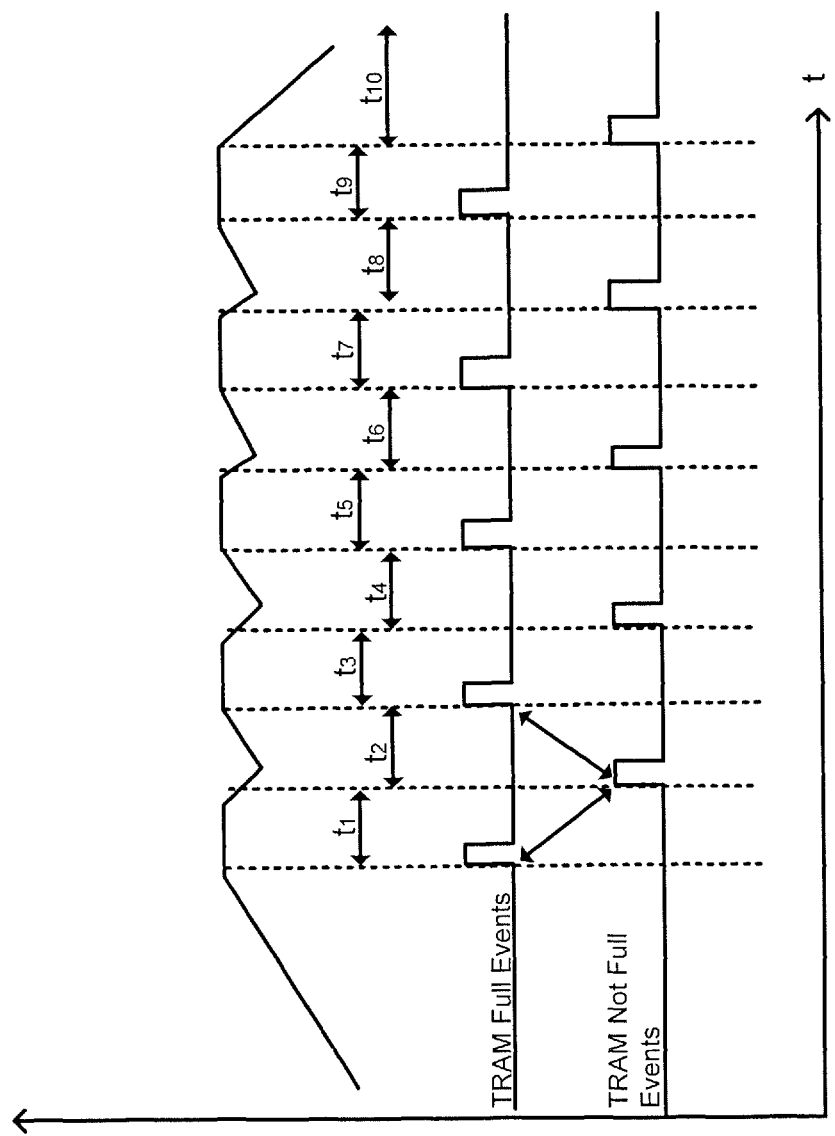
FIG. 6 is a graph of an embodiment of first burst activity versus time.
Figure 7:
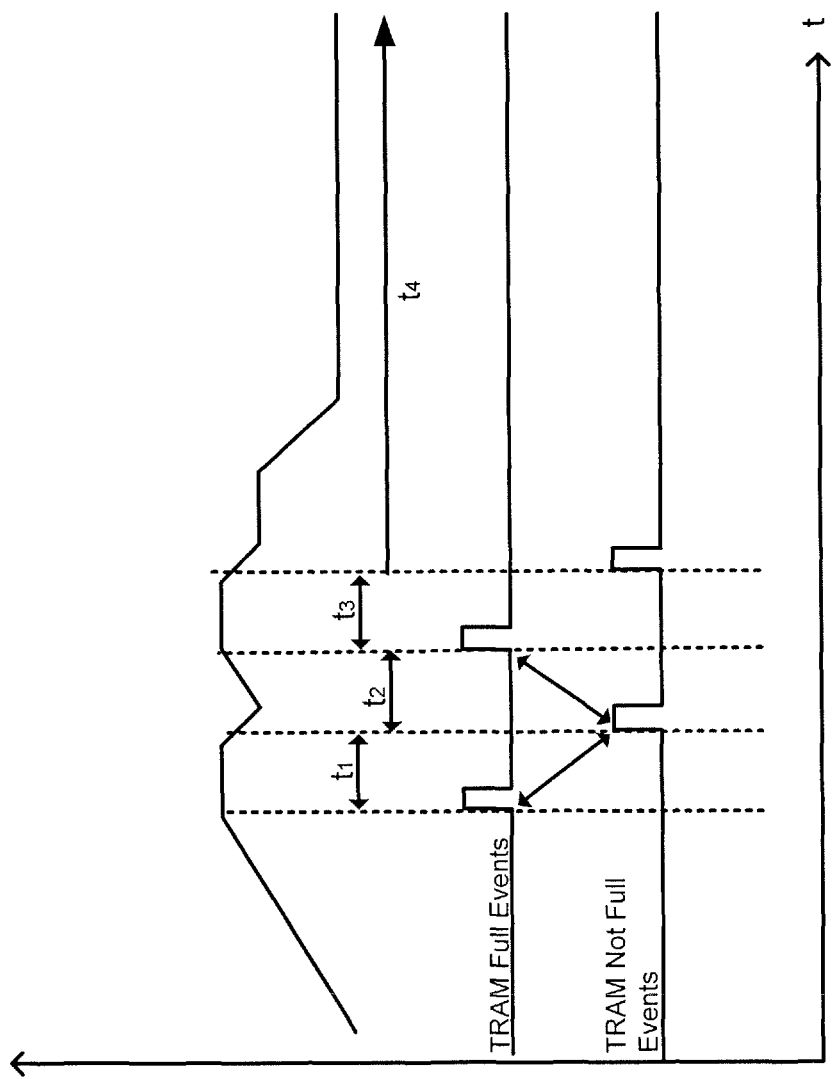
FIG. 7 is a graph of an embodiment of second burst activity versus time.

FIG. 6 is a graph showing these measurements for exemplary write activity. As shown in this timing diagram, a TRAM full event occurs when the transfer RAM 116 becomes full, and a TRAM not-full event when the transfer RAM 116 is partially evicted. In this example, t1, t3, t5, t7, and t9 are the times that the allocation level is at a first level, and t2, t4, t6, t8, and t10 are the times that the allocation level is at a second level. So, in acts 520 and 530, the sum of the TRAM full times and the sum of TRAM not-full times are accumulated in a time window. FIG. 7 is another example, where the transfer RAM 116 was filled completely and then the rate of data transferred for writing to the storage system 100 was reduced below the rate of evicting data, such that the transfer RAM 116 will not be full. (In this example, the ratio of full time versus not-full time will get smaller, and burst mode will be terminated.)

Returning to FIG. 5, the storage system 100 next computes a ratio of the two times (act 540), and compares the ratio to two thresholds, which can be pre-defined based on performance parameters of the storage system 100 (acts 550 and 570). In this way, the ratios can act as an indication to enter and exist burst mode programming. The first threshold can be defined for entering burst mode, and the second threshold can be defined for exiting burst mode. So, as shown in FIG. 5, if the ratio is greater than the first threshold (act 550), the storage system 100 enters burst mode (act 560). If the ratio is less than the second threshold (act 570), the storage system 100 exits burst mode (act 580). Put in mathematical terms, the storage system 100 enters burst mode when $\Sigma t$ TRAM full time/$\Sigma t$ TRAM not full time>threshold 1, and the storage system 100 exit burst mode when $\Sigma t$ TRAM full time/$\Sigma t$ TRAM not full time<threshold 2.

There are many advantages associated with these embodiments. For example, these embodiments can provide better performance in burst mode and better endurance of SLC blocks since burst mode will be entered and exited more properly according to host requirements and the size of the transfer RAM 116 in the storage system 100. Further, these embodiments are relatively simple to implement and require low firmware overhead (e.g., CPU time). This simplicity can also lend these embodiments to be implemented with hardware. Further, these embodiments are suitable for a "mix mode" in which there are read and write commands interleaved in the burst. This is in contrast to prior burst mode detection mechanisms that use bandwidth as a trigger. In summary, these embodiments can provide better performance and endurance tailored to the transfer RAM 116 size.

Finally, as mentioned above, any suitable type of memory can be used. Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three dimensional exemplary structures described but cover all relevant memory structures within the spirit and scope of the invention as described herein and as understood by one of skill in the art.

It is intended that the foregoing detailed description be understood as an illustration of selected forms that the invention can take and not as a definition of the invention. It is only the following claims, including all equivalents, that are intended to define the scope of the claimed invention. Finally, it should be noted that any aspect of any of the preferred embodiments described herein can be used alone or in combination with one another.

What is claimed is:

1. A method of burst detection, the method comprising:
   performing in a storage system comprising a non-volatile memory and a volatile memory:
      storing, in the volatile memory, data to be written in the non-volatile memory;
      monitoring an allocation level of the volatile memory to determine a first amount of time that the allocation level of the volatile memory is at a first level and a second amount of time that the allocation level of the volatile memory is at second level;
      entering burst mode when a ratio of the first amount of time and the second amount of time is above a first threshold; and
      exiting burst mode when the ratio of the first amount of time and the second amount of time is below a second threshold.

2. The method of claim 1, wherein the first level is when the volatile memory is full, and wherein the second level is when the volatile memory is less than full.

3. The method of claim 1 further comprising:
   storing, in the volatile memory, data read from the non-volatile memory;
   wherein the allocation level of the volatile memory accounts for both data to be stored in the non-volatile memory and data read from the non-volatile memory.

4. The method of claim 1, wherein after entering burst mode, the storage system stores the data from the volatile memory in single-level cells in the non-volatile memory, and wherein after exiting burst mode, the storage system uses multi-level cells in the non-volatile memory.

5. The method of claim 1, wherein the non-volatile memory comprises a three-dimensional memory.

6. The method of claim 1, wherein the storage system is embedded in a host.

7. The method of claim 1, wherein the storage system is removably connected to a host.

8. A storage system comprising:
   a first memory;
   a second memory configured to temporarily store data before it is stored in the first memory; and
   a controller in communication with the first and second memories, the controller configured to:
      determine a fill level of the second memory; and
      enter burst mode based on an amount of time that the fill level of the second memory stays at a predetermined level.

9. The storage system of claim 8, wherein the first memory comprises a non-volatile memory and the second memory comprises a volatile memory.

10. The storage system of claim 8, wherein the controller is configured to determine the fill level of the second memory by determining how much of the second memory has been allocated.

11. The storage system of claim 8, wherein the second memory is further configured to temporarily store data read from the first memory, and wherein the fill level of the second memory is due to both data to be stored in the first memory and data read from the first memory.

12. The storage system of claim 8, wherein the controller is further configured to store the data from the second memory in single-level cells in the first memory after entering burst mode and use multi-level cells in the first memory after exiting burst mode.

13. The storage system of claim 8, wherein the first memory comprises a three-dimensional memory.

14. The storage system of claim 8, wherein the storage system is embedded in a host.

15. The storage system of claim 8, wherein the storage system is removably connected to a host.

16. A storage system comprising:
   a first memory;
   a second memory configured to temporarily store data before it is stored in the first memory; and
   a controller in communication with the first and second memories, the controller configured to:
      determine a first amount of time that thea fill level of the second memory is at a first level and a second amount of time that the fill level of the second memory is at second level; and
      enter or exit burst mode based on the fill level of the second memory;
   wherein the controller is configured to enter burst mode when a ratio of the first amount of time and the second amount of time is above a first threshold; and
   wherein the controller is configured to exit burst mode when the ratio of the first amount of time and the second amount of time is below a second threshold.

17. The storage system of claim 16, wherein the first level is when the second memory is full, and wherein the second level is when the second memory is less than full.

18. A storage system comprising:
   a memory;
   a transfer memory configured to hold data before the data is sent to the memory for storage; and
   means for entering burst mode based on a measured amount of time it takes to refill the transfer memory to a full condition after the transfer memory is at a not-full condition.

19. The storage system of claim 18, wherein the transfer memory is further configured to hold data read from the memory.

20. The storage system of claim 18, wherein the means for using comprises a controller.

21. The storage system of claim 18, wherein the memory comprises a three-dimensional memory.

22. The storage system of claim 18, wherein the storage system is embedded in a host.

23. The storage system of claim 18, wherein the storage system is removably connected to a host.

* * * * *